United States Patent
Yoon et al.

(10) Patent No.: US 9,196,326 B2
(45) Date of Patent: Nov. 24, 2015

(54) SEMICONDUCTOR MEMORY APPARATUS

(71) Applicant: SK hynix Inc., Icheon-si Gyeonggi-do (KR)

(72) Inventors: Jung Hyuk Yoon, Icheon-si (KR); Jung Mi Tak, Icheon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/249,897

(22) Filed: Apr. 10, 2014

(65) Prior Publication Data

US 2015/0179231 A1    Jun. 25, 2015

(30) Foreign Application Priority Data

Dec. 23, 2013  (KR) .................. 10-2013-0161225

(51) Int. Cl.
*G11C 7/12* (2006.01)
*G11C 5/14* (2006.01)
*G11C 13/00* (2006.01)

(52) U.S. Cl.
CPC *G11C 7/12* (2013.01); *G11C 5/145* (2013.01); *G11C 13/0002* (2013.01); *G11C 13/0023* (2013.01); *G11C 13/0026* (2013.01); *G11C 13/0033* (2013.01); *G11C 13/0038* (2013.01)

(58) Field of Classification Search
CPC ...... G11C 7/12; G11C 5/145; G11C 13/0002; G11C 13/0023; G11C 13/0026; G11C 13/0033; G11C 13/0038
USPC ........ 365/203, 189.14, 210.13; 327/535, 530, 327/519, 520, 53, 56
See application file for complete search history.

(56) References Cited

U.S. PATENT DOCUMENTS

| | | | | |
|---|---|---|---|---|
| 7,092,279 | B1* | 8/2006 | Sheppard | G11C 7/02 257/E21.656 |
| 7,167,406 | B2* | 1/2007 | Komiya | G09G 3/325 345/82 |
| 7,746,717 | B1* | 6/2010 | Peng | G11C 7/08 365/185.2 |
| 8,553,484 | B2* | 10/2013 | Kim | G11C 11/4091 365/149 |
| 2001/0030893 | A1* | 10/2001 | Terzioglu | G11C 7/06 365/200 |
| 2002/0131320 | A1* | 9/2002 | Kurjanowicz | G11C 7/1048 365/233.1 |
| 2003/0174539 | A1* | 9/2003 | Byeon | G11C 5/147 365/185.21 |
| 2004/0105293 | A1* | 6/2004 | Jacob | G11C 11/22 365/145 |
| 2005/0174864 | A1* | 8/2005 | Jang | G11C 7/12 365/203 |
| 2007/0058448 | A1* | 3/2007 | Joshi | G11C 7/12 365/189.14 |
| 2007/0070746 | A1* | 3/2007 | Han | G11C 7/12 365/203 |
| 2007/0070773 | A1* | 3/2007 | Houston | G11C 11/413 365/229 |

(Continued)

FOREIGN PATENT DOCUMENTS

KR  1020100022788 A  3/2010
KR  1020110034980 A  4/2011

*Primary Examiner* — Vu Le
*Assistant Examiner* — Sung Cho
(74) *Attorney, Agent, or Firm* — William Park & Associates Ltd.

(57) ABSTRACT

A semiconductor memory apparatus may include a program voltage generation block configured to generate a program voltage in response to program codes; a precharge voltage generation block configured to generate a precharge voltage in response to the program codes and addresses; and a main bit line configured to be applied with the program voltage and the precharge voltage.

17 Claims, 4 Drawing Sheets

(56) References Cited

U.S. PATENT DOCUMENTS

| | | | |
|---|---|---|---|
| 2008/0247216 A1* | 10/2008 | Lamorey | G11C 13/0004 365/148 |
| 2010/0218073 A1* | 8/2010 | Kang | G06F 11/1048 714/764 |
| 2011/0305098 A1* | 12/2011 | Choi | G11C 11/406 365/203 |
| 2012/0182782 A1* | 7/2012 | Kurjanowicz | G11C 17/16 365/94 |
| 2013/0135944 A1* | 5/2013 | Braceras | G11C 5/147 365/189.07 |
| 2013/0135952 A1* | 5/2013 | Kim | G11C 11/4094 365/201 |
| 2014/0056069 A1* | 2/2014 | Park | G11C 16/0483 365/185.05 |
| 2014/0078820 A1* | 3/2014 | Li | G11C 13/0004 365/163 |
| 2014/0140128 A1* | 5/2014 | Jurasek | G11C 13/0004 365/163 |

* cited by examiner

SEMICONDUCTOR MEMORY APPARATUS

CROSS-REFERENCES TO RELATED APPLICATION

The present application claims priority under 35 U.S.C. §119(a) to Korean application number 10-2013-0161225, filed on Dec. 23, 2013, in the Korean Intellectual Property Office, which is incorporated herein by reference in its entirety.

TECHNICAL FIELD

Various embodiments generally relate to a semiconductor integrated circuit, and more particularly, to a semiconductor memory apparatus.

BACKGROUND

A semiconductor memory apparatus receives and stores data, and outputs stored data.

As a semiconductor memory apparatus trends toward high speed, high capacity and low power consumption, development of a semiconductor memory apparatus which operates at a higher speed, stores more data and consumes less power is in progress.

According to this fact, in order to develop a semiconductor memory apparatus which operates at a higher speed, efforts have been made to shorten a time required for storing data.

SUMMARY

In an embodiment, a semiconductor memory apparatus may include: a program voltage generation block configured to generate a program voltage in response to program codes; a precharge voltage generation block configured to generate a precharge voltage in response to the program codes and addresses; and a main bit line configured to be applied with the program voltage and the precharge voltage.

In an embodiment, a semiconductor memory apparatus may include: a program control block configured to generate program codes according to a program information; a program voltage generation block configured to generate a program voltage in response to the program codes; a precharge voltage generation block configured to generate a precharge voltage in response to the program codes; and a main bit line configured to be applied with the precharge voltage and the program voltage.

In an embodiment, a semiconductor memory apparatus may include: a main bit line configured to be applied with a program voltage and a precharge voltage; a data storage region configured to select one memory cell of a plurality of memory cells in response to addresses, and apply a voltage which is applied through the main bit line, to the selected memory cell; and a precharge voltage generation block configured to generate the precharge voltage in response to the addresses.

In an embodiment, a system may include: a processor; a chipset configured to couple with the processor; a memory controller configured to receive program information provided from the processor through the chipset; and a semiconductor memory apparatus configured to receive the program information, the semiconductor memory apparatus including: a program voltage generation block configured to generate a program voltage in response to program codes; a precharge voltage generation block configured to generate a precharge voltage in response to the program codes and addresses; a main bit line configured to be applied with the program voltage and the precharge voltage; and a program control block configured to generate the program codes in response to program information.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus will be described below with reference to the accompanying drawings through various examples of embodiments.

Figure 1:
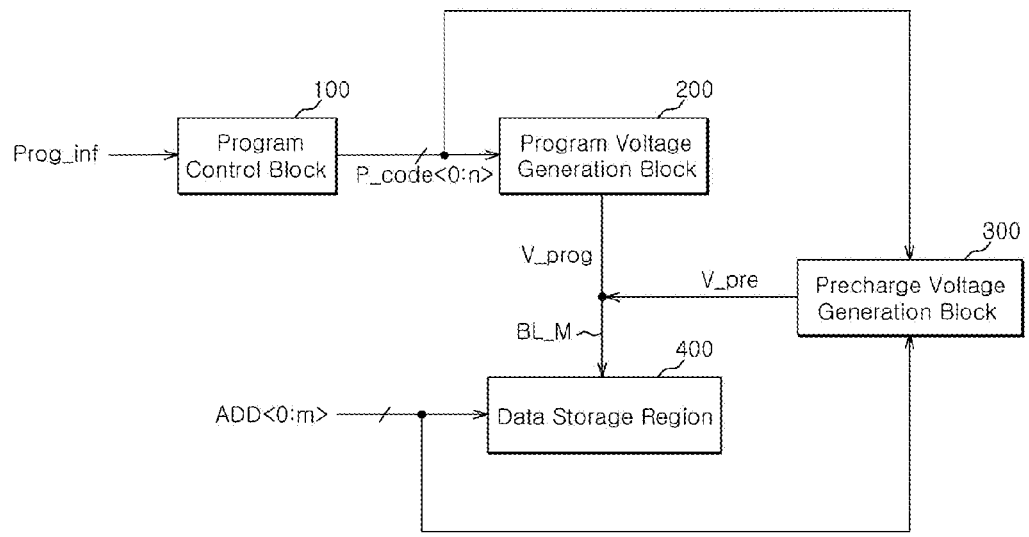
FIG. 1 is a configuration diagram of a semiconductor memory apparatus in accordance with an embodiment.

As shown in FIG. 1, a semiconductor memory apparatus in accordance with an embodiment may include a program control block 100, a program voltage generation block 200, a precharge voltage generation block 300, and a data storage region 400.

The program control block 100 may be configured to generate program codes P_code<0:n> (where n may be a natural number greater than 0) in response to program information Prog_inf. The program information Prog_inf may include command information and information for data in a data storage operation of the semiconductor memory apparatus. The program control block 100 may increase or decrease the code value of the program codes P_code<0:n> according to the command information and the information for data in the data storage operation.

The program voltage generation block 200 may be configured to generate a program voltage V_prog in response to the program codes P_code<0:n>. For example, the program voltage generation block 200 may be configured to raise the voltage level of the program voltage V_prog as the code value of the program codes P_code<0:n> increases. In an embodiment, the program voltage generation block 200 may be configured to lower the voltage level of the program voltage V_prog as the code value of the program codes P_code<0:n> increases.

The precharge voltage generation block 300 may be configured to generate a precharge voltage V_pre in response to the program codes P_code<0:n> and addresses ADD<0:m> (where m is a natural number greater than 0). For example, the precharge voltage generation block 300 primarily selects the voltage level of the precharge voltage V_pre in response to the program codes P_code<0:n>, secondarily selects the voltage level of the precharge voltage V_pre in response to the addresses ADD<0:m>, and outputs the precharge voltage V_pre of the secondarily selected voltage level, to a main bit line BL_M. The main bit line BL_M transfers the program voltage V_prog and the precharge voltage V_pre to the data storage region 400.

The data storage region 400 may be configured to store data in response to the addresses ADD<0:m> and a voltage received through the main bit line BL_M. For example, the data storage region 400 stores a data value corresponding to the level of the voltage received through the main bit line BL_M, at a position which is designated by the addresses ADD<0:m>.

Figure 2:
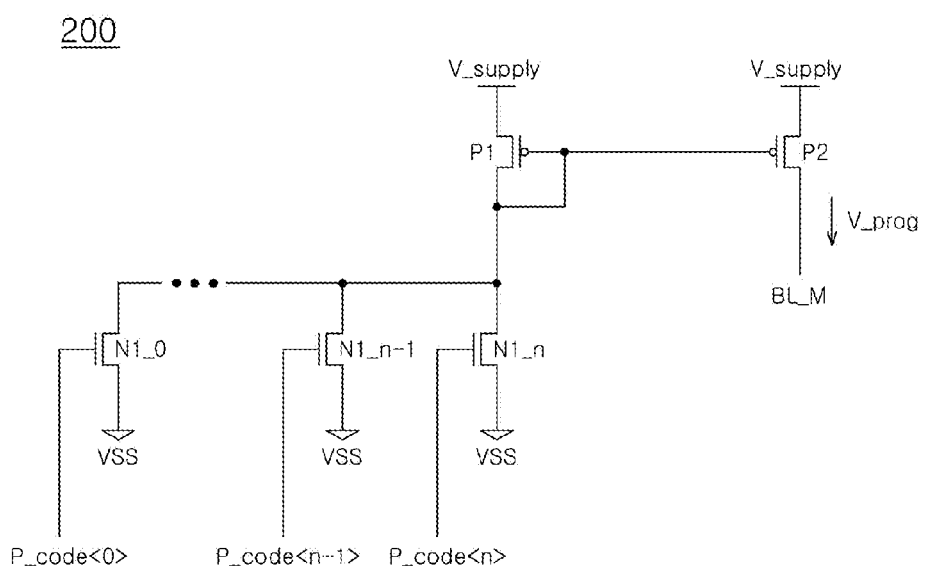
FIG. 2 is a configuration diagram of the program voltage generation block shown in FIG. 1.

As shown in FIG. 2, the program voltage generation block 200 may include a plurality of first NMOS transistors N1_0 to N1_$n$ (where n is a natural number greater than 0) and first and second PMOS transistors P1 and P2.

The plurality of first NMOS transistors N1_0 to N1_$n$ have gates which receive respective bits of the program codes P_code<0:n>, drains which are commonly electrically coupled, and the sources which are electrically coupled to a ground terminal VSS. The first PMOS transistor P1 has a gate and a drain to which a node commonly electrically coupled with the drains of the plurality of first NMOS transistors N1_0 to N1_$n$ is electrically coupled, and a source which is applied with a supply voltage V_supply. The second PMOS transistor P2 has a gate to which the gate of the first PMOS transistor P1 is electrically coupled, a source which is coupled with the supply voltage V_supply, and a drain to which the main bit line BL_M is electrically coupled. The second PMOS transistor P2 may output the program voltage V_prog to the main bit line BL_M.

In the program voltage generation block 200 configured as mentioned above, the voltage level of the program voltage V_prog rises as the number of high levels in the respective bits of the program codes P_code<0:n> increases. In detail, as the number of high levels in the respective bits of the program codes P_code<0:n> increases, the voltage level of the gate of the first PMOS transistor P1 falls. If the voltage level of the gate of the first PMOS transistor P1 falls, the voltage level of the gate of the second PMOS transistor P2 falls as well. Thus, the voltage level of the program voltage V_prog which is outputted from the drain of the second PMOS transistor P2 rises.

Figure 3:
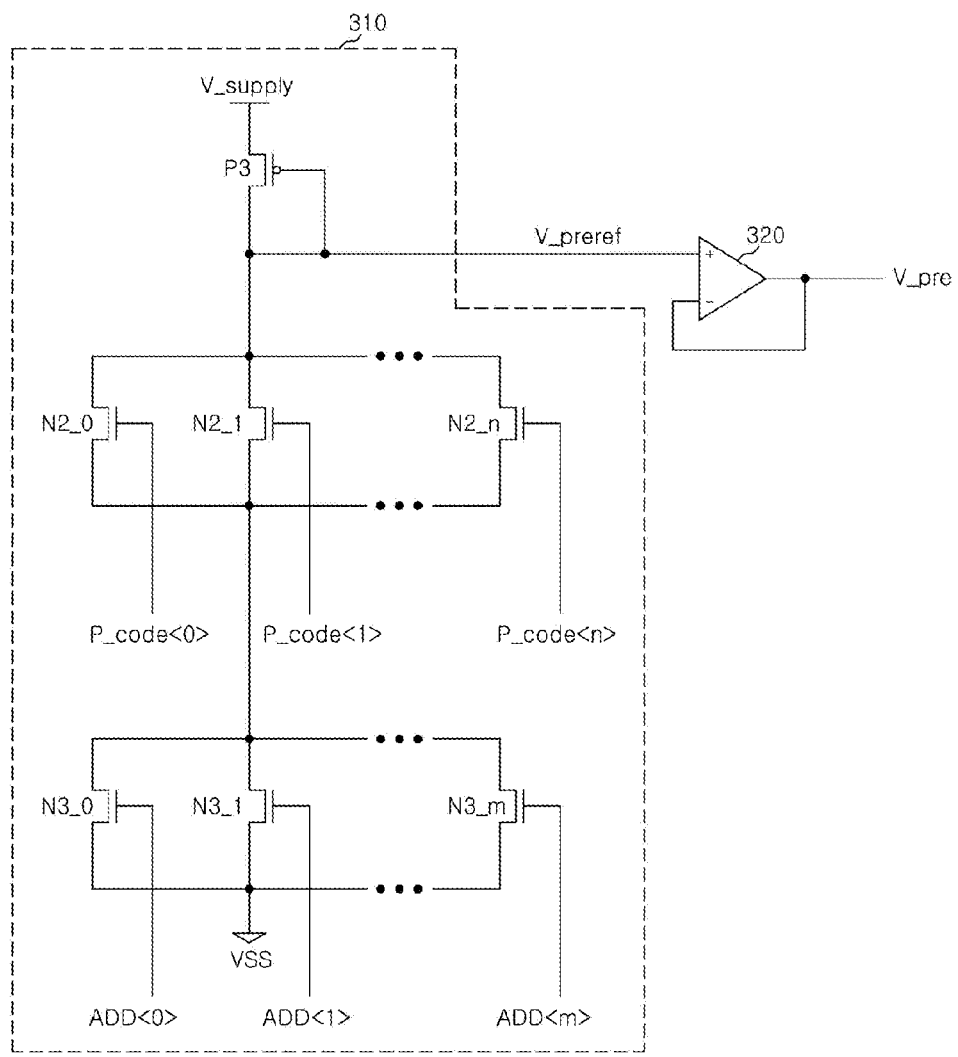
FIG. 3 is a configuration diagram of the precharge voltage generation block shown in FIG. 1.

As shown in FIG. 3, the precharge voltage generation block 300 may include a precharge reference voltage generation unit 310, and a comparison unit 320. The precharge reference voltage generation unit 310 may be configured to generate a precharge reference voltage V_preref in response to the program codes P_code<0:n> and the addresses ADD<0:m>. For example, the precharge reference voltage generation unit 310 may raise the voltage level of the precharge reference voltage V_preref as the code value of the program codes P_code<0:n> increases, and may raise the voltage level of the precharge reference voltage V_preref as the value of the addresses ADD<0:m> increases. As the value of the addresses ADD<0:m> increases, the distance between a memory cell selected in the data storage region 400 and the main bit line BL_M may be shortened.

The precharge reference voltage generation unit 310 may include a plurality of second NMOS transistors N2_0 to N2_$n$ (where n may be a natural number greater than 0), a plurality of third NMOS transistors N3_0 to N3_$m$ (where m may be a natural number greater than 0), and a third PMOS transistor P3.

The plurality of second NMOS transistors N2_0 to N2_$n$ may have gates to which the respective bits of the program codes P_code<0:n> are inputted, drains which may be commonly electrically coupled, and sources which may be commonly electrically coupled. The plurality of third NMOS transistors N3_0 to N3_$m$ may have gates to which the respective signals of the addresses ADD<0:m> are inputted, drains which may be commonly electrically coupled, and sources which may be commonly electrically coupled. A node to which the respective sources of the plurality of second NMOS transistors N2_0 to N2_$n$ are commonly electrically coupled is electrically coupled with a node to which the respective drains of the plurality of third NMOS transistors N3_0 to N3_$m$ are commonly electrically coupled. A node to which the respective sources of the plurality of third NMOS transistors N3_0 to N3_$m$ are commonly electrically coupled may be electrically coupled to the ground terminal VSS. The third PMOS transistor P3 may have a gate and a drain which are electrically coupled to a node to which the respective drains of the plurality of second NMOS transistors N2_0 to N2_$n$ are commonly electrically coupled, and a source which is electrically coupled with the supply voltage V_supply. The precharge reference voltage V_preref may be outputted from a node to which the drain and the gate of the third PMOS transistor P3 is electrically coupled.

The comparison unit 320 may be configured to compare the voltage level of the precharge reference voltage V_preref and the voltage level of the precharge voltage V_pre, and generate the precharge voltage V_pre which has a voltage level corresponding to the voltage level of the precharge reference voltage V_preref. For example, the comparison unit 320 may raise the voltage level of the precharge voltage V_pre if the voltage level of the precharge reference voltage V_preref rises, and may lower the voltage level of the precharge voltage V_pre if the voltage level of the precharge reference voltage V_preref falls.

Figure 4:
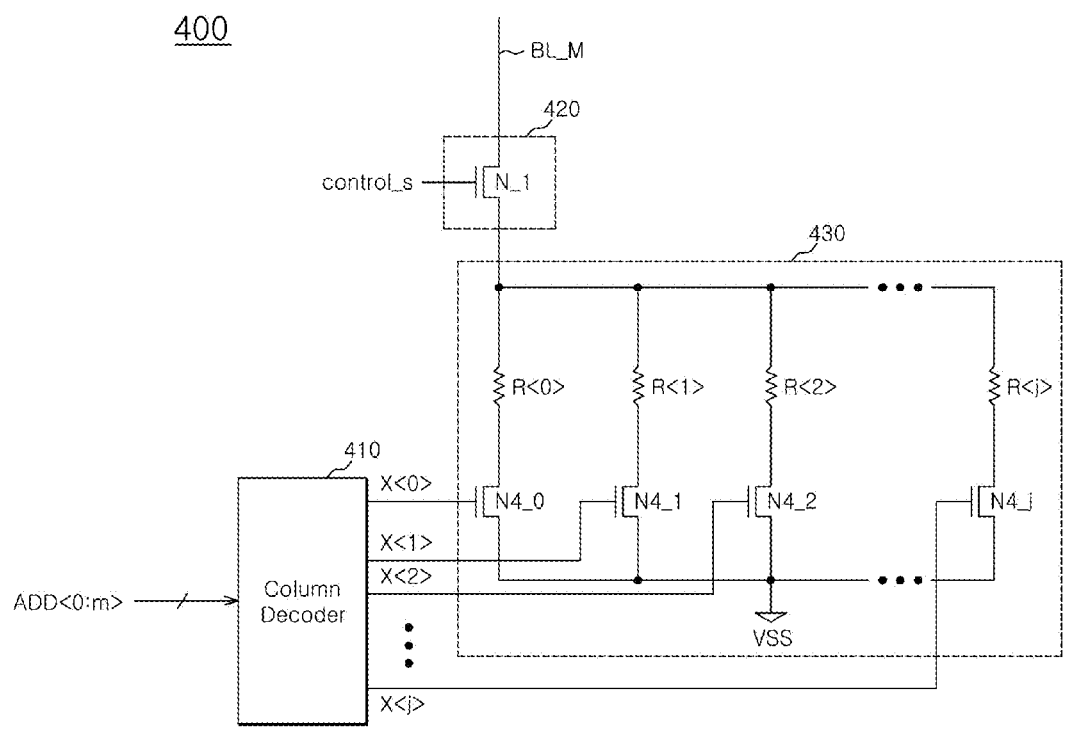
FIG. 4 is a configuration diagram of the data storage region shown in FIG. 1.

As shown in FIG. 4, the data storage region 400 may include a column decoder 410, a switch 420, and a memory cell array 430.

The column decoder 410 may be configured to decode the addresses ADD<0:m> and enable one of a plurality of column select signals X<0:j> (where j may be a natural number greater than 0). The column decoder 410 may enable a column select signal X<j> which is to turn on a transistor N4_$j$ which is electrically coupled with a resistive memory element R<j> which is close to the main bit line BL_M, as the value of the addresses ADD<0:m> increases.

The switch 420 may be configured to electrically couple the main bit line BL_M to the memory cell array 430 in response to a control signal control_s. For example, the switch 420 electrically couples the main bit line BL_M to the memory cell array 430 when the control signal control_s is enabled. The switch 420 may be constituted by an NMOS transistor N_1. The NMOS transistor N_1 has the gate to which the control signal control_s is inputted, the drain to which the main bit line BL_M is electrically coupled, and the source to which the data storage region 430 is electrically coupled. The control signal control_s is a signal which may be enabled in the data storage operation of the semiconductor memory apparatus and in an operation of the semiconductor memory apparatus for outputting stored data.

The memory cell array 430 may include a plurality of resistive memory elements R<0:j> and a plurality of fourth NMOS transistors N4_0 to N4_$j$. The plurality of resistive memory elements R<0:j> have one ends which are commonly electrically coupled and the other ends to which the drains of the plurality of fourth NMOS transistors N4_0 to N4_$j$ are respectively electrically coupled. The plurality of fourth NMOS transistors N4_0 to N4_$j$ have gates to which the plurality of column select signals X<0:j> are respectively inputted, and sources which are commonly electrically coupled and are then electrically coupled to the ground terminal VSS.

Operations of the data storage region 400 will be described below.

For example, a resistive memory element R<ji> which is electrically coupled with a fourth NMOS transistor N4_$j$ which is to be turned on by a column select signal X<j> which is enabled by decoding the addresses ADD<0:m> may be selected. If the control signal control_s is enabled, a current path is formed through the switch 420, the selected resistive memory element R<j> and the turned-on fourth NMOS transistor N4_j, and current flows through and a voltage is applied to the selected resistive memory element R<j>.

The semiconductor memory apparatus in accordance with an embodiment, configured as mentioned above, operates as follows.

The program control block 100 may generate the program codes P_code<0:n> according to the program information Prog_inf in the data storage operation of the semiconductor memory apparatus. The program information Prog_inf may include command information and information for data in the data storage operation of the semiconductor memory apparatus.

The program voltage generation block 200 may generate the program voltage V_prog according to the code value of the program codes P_code<0:n>, and may transfer the program voltage V_prog to the main bit line BL_M.

The precharge voltage generation block 300 may generate the precharge voltage V_pre in response to the program codes P_code<0:n> and the addresses ADD<0:m>.

The precharge voltage generation block 300 primarily determines the voltage level of the precharge voltage V_pre according to the code value of the program codes P_code<0:n>, and changes the primarily determined voltage level of the precharge voltage V_pre and secondarily determines the voltage level of the precharge voltage V_pre according to the addresses ADD<0:m>. The precharge voltage V_pre of which voltage level is secondarily determined is transferred to the main bit line BL_M.

The data storage region 400 performs the operation of storing data, by applying the voltage transferred from the main bit line BL_M, to the resistive memory element R<j> at a position selected according to the addresses ADD<0:m>.

When the voltage level of the main bit line BL_M becomes a predetermined voltage level and is applied to the selected resistive memory element R<j>, the resistance value of the resistive memory element R<j> is normally changed. When the resistance value of the resistive memory element R<j> is normally changed, data is normally stored. In a conventional semiconductor memory apparatus which uses only the program voltage V_prog, a time required for the voltage level of a main bit line to reach the predetermined voltage level is longer than the semiconductor memory apparatus in accordance with the embodiments of the present disclosure. In the semiconductor memory apparatuses in accordance with the embodiments of the present disclosure, since the voltage level of the main bit line BL_M is raised using not only the program voltage V_prog but also the precharge voltage V_pre, a time required for the voltage level of the main bit line BL_M to reach the predetermined voltage level is shorter than the time required for the voltage level of the main bit line of the conventional semiconductor memory apparatus to reach the predetermined voltage level. Also, in accordance with the embodiments of the present disclosure, since the program voltage V_prog and the precharge voltage V_pre are generated according to the program information Prog_inf including an information for stored data, when the program voltage V_prog with a high voltage level is needed, the voltage level of the precharge voltage V_pre is raised. Further, in accordance with the embodiments of the present disclosure, when the program voltage V_prog with a low voltage level is needed, the voltage level of the precharge voltage V_pre is lowered.

In the embodiments of the present disclosure, because the voltage level of the main bit line BL_M is controlled by generating the program voltage V_prog and the precharge voltage V_pre according to the information (value) of data, a time required for the data storage operation may be shortened.

Moreover, in the embodiments of the present disclosure, the voltage level of the precharge voltage V_pre is controlled according to the addresses ADD<0:m>. That is to say, since the addresses ADD<0:m> select resistive memory cells in which data are to be stored, the voltage level of the precharge voltage V_pre is lowered as a resistive memory cell close to the main bit line BL_M is selected. Conversely, the voltage level of the precharge voltage V_pre is raised as a resistive memory cell far from the main bit line BL_M is selected.

In general, in the case of the same program information, because the level of a voltage to be transferred from a main bit line to a selected resistive memory cell decreases as the selected resistive memory cell is distant from the main bit line, a resistive memory cell which is far from the main bit line cannot help but be applied with a voltage with a low level when compared to a resistive memory cell close to the main bit line.

However, in the semiconductor memory apparatuses in accordance with the embodiments of the present disclosure, due to the fact that the level of a precharge voltage is increased when a resistive memory cell far from a main bit line is selected in response to an address and is decreased when a resistive memory cell close to the main bit line is selected in response to an address, the same voltage may be provided to a selected resistive memory cell regardless of a distance to the main bit line in the case of the same program information.

As a consequence, the data storage reliability of a semiconductor memory apparatuses, in accordance with the embodiments of the present disclosure, may be improved.

Figure 5:
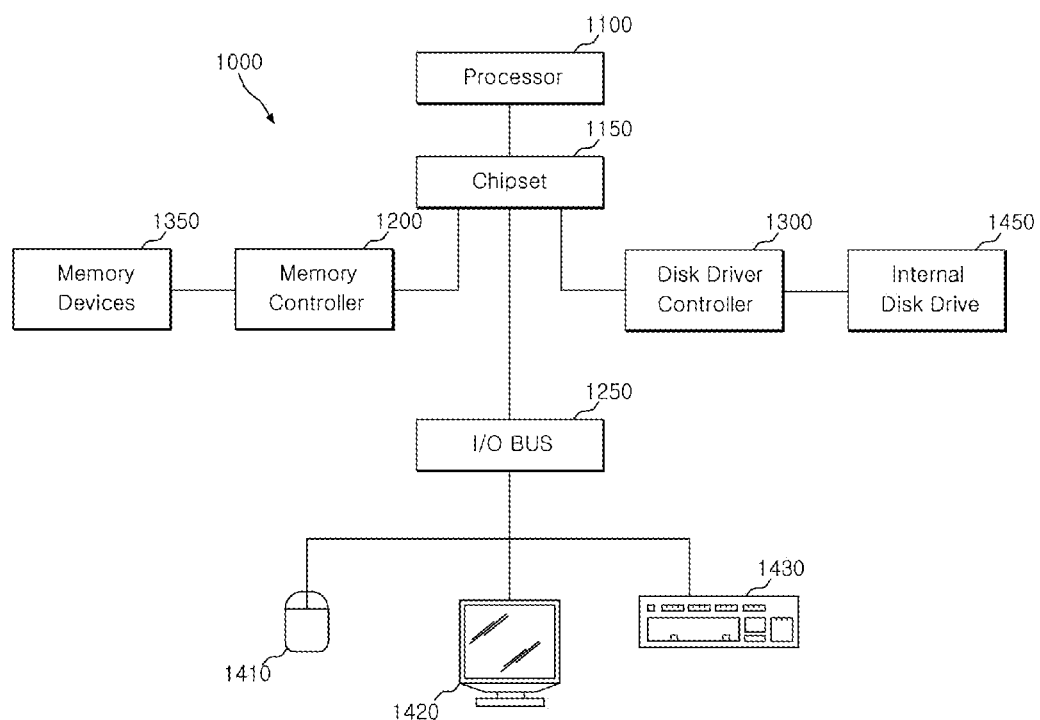
FIG. 5 illustrates a block diagram of a system employing the semiconductor memory apparatus in accordance with the embodiments discussed above with relation to FIGS. 1-4.

The semiconductor memory apparatus discussed above is particular useful in the design of memory devices, processors, and computer systems. For example, referring to FIG. 5, a block diagram of a system employing a semiconductor memory apparatus in accordance with the embodiments of the description is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus discussed above with relation to FIGS. 1-4, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor memory apparatus as discussed above with relation to FIGS. 1-4. In alternate embodiments, such as cellular phones or digital cameras, the components may differ from the embodiments shown in FIG. 5.

While various embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a program voltage generation block configured to generate a program voltage in response to program codes;
   a precharge voltage generation block configured to generate a precharge voltage in response to the program codes and addresses; and
   a main bit line configured to be applied with the program voltage and the precharge voltage,
   wherein the precharge voltage generation block decreases a level of the precharge voltage in response to the addresses when a memory cell close to the main bit line is selected in response to the addresses than when the memory cell far from the main bit line is selected in response to the addresses.

2. The semiconductor memory apparatus according to claim 1, further comprising:
   a data storage region configured to store data in response to the addresses and a voltage which is transferred through the main bit line.

3. The semiconductor memory apparatus according to claim 1, further comprising:
   a program control block configured to generate the program codes in response to program information.

4. The semiconductor memory apparatus according to claim 2, wherein the program information comprises an information of data which is to be stored by a data storage operation.

5. The semiconductor memory apparatus according to claim 2,
   wherein the data storage region comprises a plurality of memory cells, and
   wherein one of the plurality of memory cells stores data by being applied with a voltage applied from the main bit line, in response to the addresses.

6. The semiconductor memory apparatus according to claim 5, wherein the precharge voltage generation block primarily selects a voltage level of the precharge voltage in response to the program codes, secondarily selects the primarily selected voltage level of the precharge voltage in response to the addresses, and applies the precharge voltage of the secondarily selected voltage level to the main bit line.

7. The semiconductor memory apparatus according to claim 6, wherein the precharge voltage generation block changes the voltage level of the precharge voltage according to a distance between a memory cell which is selected according to the addresses and the main bit line.

8. The semiconductor memory apparatus according to claim 7, wherein the precharge voltage generation block lowers the voltage level of the precharge voltage as the distance between the selected memory cell and the main bit line decreases.

9. The semiconductor memory apparatus according to claim 7, wherein the precharge voltage generation block raises the voltage level of the precharge voltage as the distance between the selected memory cell and the main bit line increases.

10. A semiconductor memory apparatus comprising:
    a program control block configured to generate program codes according to program information;
    a program voltage generation block configured to generate a program voltage in response to the program codes;
    a precharge voltage generation block configured to generate a precharge voltage in response to the program codes; and
    a main bit line configured to be applied with the precharge voltage and the program voltage,
    wherein the precharge voltage generation block decreases a level of the precharge voltage in response to the program code when a memory cell close to the main bit line is selected than when the memory cell far from the main bit line is selected.

11. The semiconductor memory apparatus according to claim 10, further comprising:
    a data storage region configured to be applied with a voltage which is applied from the main bit line, and store data.

12. The semiconductor memory apparatus according to claim 10, wherein the precharge voltage generation block generates the precharge voltage which has a voltage level proportional to a voltage level of the program voltage, in response to the program codes.

13. A semiconductor memory apparatus comprising:
    a main bit line configured to be applied with a program voltage and a precharge voltage;
    a data storage region configured to select one memory cell of a plurality of memory cells in response to addresses, and apply a voltage which is applied through the main bit line, to the selected memory cell; and a precharge voltage generation block configured to generate the precharge voltage in response to the addresses, wherein the precharge voltage generation block decreases a level of the precharge voltage in response to the addresses when a memory cell close to the main bit line is selected in response to the addresses than when the memory cell far from the main bit line is selected in response to the addresses.

14. The semiconductor memory apparatus according to claim 13, wherein the precharge voltage generation block changes a voltage level of the precharge voltage according to a distance between the main bit line and the selected memory cell, in response to the addresses.

15. The semiconductor memory apparatus according to claim 14, wherein the precharge voltage generation block raises the voltage level of the precharge voltage in response to the addresses as the distance between the selected memory cell and the main bit line increases.

16. The semiconductor memory apparatus according to claim 14 wherein the precharge voltage generation block lowers the voltage level of the precharge voltage in response to the addresses as the distance between the selected memory cell and the main bit line decreases.

17. A system comprising:
a processor;
a chipset configured to couple with the processor;
a memory controller configured to receive program information provided from the processor through the chipset; and
a semiconductor memory apparatus configured to receive the program information, the semiconductor memory apparatus comprising:
a program voltage generation block configured to generate a program voltage in response to program codes;
a precharge voltage generation block configured to generate a precharge voltage in response to the program codes and addresses;
a main bit line configured to be applied with the program voltage and the precharge voltage; and
a program control block configured to generate the program codes in response to program information,
wherein the precharge voltage generation block decreases a level of the precharge voltage in response to the program codes and the addresses when a memory cell close to the main bit line is selected than when the memory cell far from the main bit line is selected.

* * * * *